(12) United States Patent
Kaino

(10) Patent No.: US 10,211,079 B2
(45) Date of Patent: Feb. 19, 2019

(54) WORKPIECE TRANSFER SYSTEM

(71) Applicant: NIDEC SANKYO CORPORATION, Suwa-gun, Nagano (JP)

(72) Inventor: Shigeyuki Kaino, Nagano (JP)

(73) Assignee: NIDEC SANKYO CORPORATION, Nagano (JP)

( * ) Notice: Subject to any disclaimer, the term of this patent is extended or adjusted under 35 U.S.C. 154(b) by 221 days.

(21) Appl. No.: 15/206,618

(22) Filed: Jul. 11, 2016

(65) Prior Publication Data

US 2016/0322245 A1 Nov. 3, 2016

Related U.S. Application Data

(62) Division of application No. 13/982,972, filed as application No. PCT/JP2012/080074 on Nov. 20, 2012, now Pat. No. 9,412,633.

(Continued)

(51) Int. Cl.
*H01L 21/67* (2006.01)
*H01L 21/677* (2006.01)

(52) U.S. Cl.
CPC .. *H01L 21/67742* (2013.01); *H01L 21/67173* (2013.01); *H01L 21/67703* (2013.01);
(Continued)

(58) Field of Classification Search
CPC ......... H01L 21/67703; H01L 21/67736; H01L 21/67745; H01L 21/67748;
(Continued)

(56) References Cited

U.S. PATENT DOCUMENTS 642,738 A    2/1900 Borel
5,314,509 A * 5/1994 Kato ................. B01J 3/006
                                                134/902
(Continued)

FOREIGN PATENT DOCUMENTS

JP    2001053131 A    2/2001
JP    2001274221 A    10/2001
(Continued)

OTHER PUBLICATIONS

International Search Report for International Application No. PCT/JP2012/080074; dated Feb. 26, 2013, with English Translation.
(Continued)

*Primary Examiner* — Saul Rodriguez
*Assistant Examiner* — Ashley K Romano
(74) *Attorney, Agent, or Firm* — Cantor Colburn LLP

(57) ABSTRACT

The present application provides a workpiece transfer system in which a production efficiency of a production line to be used can be improved. For example, a workpiece transfer system 1 includes: robots 11 & 12 placed in front of process modules 4 & 6 for conducting a predetermined processing operation on a workpiece W, the robots 11 & 12 bringing the workpiece W into the process modules 4 & 6 and taking the workpiece W out of the process modules 4 & 6; a workpiece storage unit 13 for storing the workpiece W to be brought into the process modules 4 & 6 and the workpiece W taken out of the process modules 4 & 6; and a transfer mechanism 14 for transferring the workpiece storage unit 13 in a direction almost perpendicular to a direction of bringing in and taking out the workpiece W for the process modules 4 & 6.

3 Claims, 5 Drawing Sheets

Related U.S. Application Data

(60) Provisional application No. 61/563,183, filed on Nov. 23, 2011.

(52) U.S. Cl.
 CPC .. *H01L 21/67736* (2013.01); *H01L 21/67745* (2013.01); *H01L 21/67748* (2013.01); *H01L 21/67778* (2013.01)

(58) Field of Classification Search
 CPC ......... H01L 21/67742; H01L 21/67173; H01L 21/67778
 See application file for complete search history.

(56) References Cited

U.S. PATENT DOCUMENTS

| | | |
|---|---|---|
| 6,491,518 B1 | 12/2002 | Fujikawa et al. |
| 7,308,757 B2 | 12/2007 | Fukuhara et al. |
| 7,347,656 B2 | 3/2008 | Soraoka et al. |
| 7,628,824 B2 | 12/2009 | Machida |
| 8,744,614 B2 | 6/2014 | Machida |
| 2004/0105737 A1 | 6/2004 | Ozawa et al. |
| 2008/0232947 A1 | 9/2008 | Van Der Meulen et al. |
| 2008/0236615 A1 | 10/2008 | Mimken et al. |
| 2009/0252578 A1 | 10/2009 | Machida |
| 2010/0321648 A1 | 12/2010 | Nakaharada et al. |

FOREIGN PATENT DOCUMENTS

| | | |
|---|---|---|
| JP | 2002270669 A | 9/2002 |
| JP | 2002305225 A | 10/2002 |
| JP | 2002334918 A | 11/2002 |
| JP | 2003170378 A | 6/2003 |
| JP | 2010182919 A | 8/2010 |
| JP | 2011003864 A | 1/2011 |

OTHER PUBLICATIONS

U.S. Final Office Action corresponding to U.S. Appl. No. 13/982,972; dated Dec. 10, 2015.

U.S. Non-Final Office Action corresponding to U.S. Appl. No. 13/982,972; dated Jul. 10, 2015.

\* cited by examiner

WORKPIECE TRANSFER SYSTEM

CROSS REFERENCE TO RELATED APPLICATIONS

The present application is a divisional application of U.S. patent application Ser. No. 13/982,972, filed Jul. 31, 2013, the entire contents of which are incorporated herein by reference. The Ser. No. 13/982,972 application is the U.S. national stage of International Application No. PCT/JP2012/080074, filed on Nov. 20, 2012 which claimed priority to U.S. Provisional Application 61/563,183 filed Nov. 23, 2011, and the contents of which are also incorporated by reference herein.

FIELD OF THE INVENTION

The present invention relates to a workpiece transfer system for transferring a workpiece such as a semiconductor wafer, an LCD panel, a solar cell, and the like in a production line.

BACKGROUND

In a production line having a plurality of process modules that perform a predetermined process for a workpiece, popularly used is an industrial robot that transfers a workpiece among a plurality of process modules. For example, as shown in FIG. 6 and FIG. 7, an industrial robot 102 (i.e., a robot 102) is used in a production line 101 for producing semiconductors. The production line 101 includes an Equipment Front End Module (EFEM), being not illustrated in the drawings; and for example, four process modules 103, 104, 105, and 106. The process module 103 and the process module 104 are so placed as to be stacked in a vertical direction, and meanwhile the process module 105 and the process module 106 are so placed as to be stacked in a vertical direction. Moreover, the process modules 103 & 104 and the process modules 105 & 106 are so placed as to have a predetermined space between their two groups, in a direction X of horizontal directions in FIG. 6 and FIG. 7. Between the process modules 103 & 104 and the EFEM, provided is a buffer 108 for temporarily storing a semiconductor wafer W (a wafer W), as a workpiece, before supplying the wafer to the process modules 103 through 106. Incidentally, a wafer W stored in the EFEM is supplied to the buffer 108 by a robot being not illustrated in the drawings.

The robot 102 is equipped with an end effector 111 for grasping a wafer W. Concretely to describe, the robot 102 is equipped with two end effectors 111; one is for receiving a wafer W from the buffer 108, and the other is for placing a wafer W into the buffer 108. Furthermore, the robot 102 includes: an arm 112 to which the end effector 111 is connected so as to be rotatable; an arm driving mechanism for elongating/contracting the arm 112 to move the end effector 111 horizontally; a rotation mechanism for rotating the arm 112 around a root-end side portion of the arm 112 while using a vertical direction as a shaft direction; a lifting mechanism 113 for lifting up and down the end effector 111; and a transfer mechanism 114 for transferring the end effector 111 in the direction X. The robot 102 transfers the wafer W between the buffer 108 and the process modules 103 through 106.

In the production line 101, though sometimes the wafer W after being processed at one of the process modules 103 through 106 is subsequently supplied to another one of the process modules 103 through 106 for completing a predetermined process, the wafer W is usually returned to the buffer 108. Then, at each of the process modules 103 through 106, a predetermined processing operation is conducted on the wafer W. At first, in the production line 101, the robot 102 receives the wafer W, which has been supplied from the EFEM and stored in the buffer 108, from the buffer 108; and transfers the wafer W, for example, to the process modules 103. Then, the robot 1 takes out the processed wafer W from the process modules 103, and transfers the processed wafer W again to the buffer 108. Moreover, the robot 102 receives the wafer W from the buffer 108, and transfers the wafer W, for example, to the process modules 105. By way of repeating these operations, the production line 101 executes a predetermined process for the wafer W. Namely, in the production line 101, the predetermined process is executed for the wafer W with the robot 102 moving back and forth several times between the process modules 103 through 106, where the wafer W is processed, and the buffer 108.

Under conditions where a processed wafer W exists in the process modules 103 through 106; for example, at the time when a wafer W is transferred to the process module 103, the robot 102 at the process module 103 takes out the processed wafer W, which has been processed in the process module 103, from the process module 103 by using one of the two end effectors 111. At the same time, the robot 102 places a wafer W, which has been taken out from the buffer 108 and being grasped by the other of the two end effectors 111, into the process module 103. Subsequently, the robot 102 transfers the processed wafer W, which has been taken out from the process module 103 and being grasped by the said one of the two end effectors 111, to the buffer 108. Moreover, at the buffer 108, the robot 102 takes out a wafer W, to be processed in the process module 105 for example, from the buffer 108 by using the said other of the two end effectors 111. At the same time, the robot 102 places the wafer W, which has been taken out from the process module 103 and being grasped by the said one of the two end effectors 111, into the buffer 108.

For materialization of the production line 101 being efficient, it is important to appropriately balance a performance of processing wafers W by the process modules 103 through 106, a performance of transferring the wafers W by the robot 102, and a layout of the process modules 103 through 106, in the production line 101. Particularly in the case of the production line 101 in which the process modules 103 & 104 and the process modules 105 & 106 are so placed as to have a predetermined space between their two groups, in the direction X, as shown in FIG. 6 and FIG. 7; for materialization of the production line 101 being efficient, it is important to improve efficiency of transferring the wafers W. In other words, in the production line 101, for materialization of the production line 101 being efficient, it is important to increase a transfer speed of the robot 102 in the direction X.

In the meantime, unfortunately weight of a robot to be used generally in a production line for production of semiconductors and the like ranges from 50 to 100 kilograms, in accordance with a function in relation to the robot. Therefore, when it is intended to safely operate the robot 102 in the production line 101 for example, it is difficult to increase the transfer speed of the robot 102 in the direction X in such a way as to be faster than a conventional speed. Accordingly, it is difficult to improve a production efficiency of the production line 101, in such a way as to make it better than a conventional efficiency.

Thus, at least an embodiment of the present invention provides a workpiece transfer system in which a production efficiency of a production line to be used can be enhanced, and to provide a workpiece transfer system in which a production efficiency of a production line can be improved particularly when being used in a production line where a workpiece such as a semiconductor and the like is transferred for a relatively long distance.

To bring a solution for the subject described above, a workpiece transfer system according to at least an embodiment of the present invention includes; a robot placed in front of a process module for conducting a predetermined processing operation on a workpiece, the robot bringing the workpiece into the process module and taking the workpiece out of the process module; a workpiece storage unit for storing the workpiece to be brought into the process module and the workpiece taken out of the process module; and a transfer mechanism for transferring the workpiece storage unit in a direction almost perpendicular to a direction of bringing in and taking out the workpiece for the process module.

The workpiece transfer system according to at least an embodiment of the present invention includes the workpiece storage unit for storing the workpiece, and the transfer mechanism for transferring the workpiece storage unit in the direction almost perpendicular to the direction of bringing in and taking out the workpiece for the process module. Therefore, simply needed is to transfer the workpiece storage unit instead of the robot, in the direction almost perpendicular to the direction of bringing in and taking out the workpiece for the process module, wherein the workpiece storage unit being able to have a reduced lighter weight, compared to the robot. Accordingly, the workpiece storage unit can safely be transferred even though a transfer speed of the workpiece storage unit is set to be higher than a transfer speed of the robot. In other words, efficiency of transferring the workpiece can be improved by way of increasing the transfer speed of the wafer storage unit. As a result, production efficiency of the production line, in which the workpiece transfer system is used, can be improved. Furthermore, the transfer speed of the wafer storage unit can be increased, and therefore if the workpiece transfer system according to at least an embodiment of the present invention is used in a production line in which a workpiece is transferred for a comparatively long distance, the production efficiency of the production line can be further improved.

In at least an embodiment of the present invention, it is preferable that the workpiece transfer system includes a plurality of robots laid out in the transfer direction of the workpiece storage unit and the workpiece storage unit is able to store a plurality of workpieces. According to this configuration, for example, at an installation spot of the buffer 108 explained with reference to FIG. 6 and FIG. 7, a plurality of wafers can be stored in the workpiece storage unit. Therefore, in the case where this workpiece transfer system is used in a production line in which a plurality of process modules are placed in the transfer direction of the workpiece storage unit; even though, after one of the plurality of robots takes out a workpiece, the workpiece storage unit moves directly to a installation spot of another of the robots without returning to the installation spot of the buffer, the latter robot can take out a workpiece stored in the workpiece storage unit. Accordingly, the production efficiency of the production line, in which the workpiece transfer system is used, can effectively be improved.

In at least an embodiment of the present invention, it is preferable that the workpiece storage unit is placed between the process module and the robot, in the direction of bringing in and taking out the workpiece for the process module. According to this configuration, it is simply needed for an end effector of the robot to move from a specified standby position toward the workpiece storage unit, and further move in the same direction as it has done, even after receiving a workpiece at the workpiece storage unit in order to bring the workpiece into the process module. Moreover, the end effector that has moved from the process module toward the workpiece storage unit and stored the workpiece in the workpiece storage unit simply needs to move in the same direction as it has done, to the specified standby position. Therefore, control of the robot can be simplified.

In at least an embodiment of the present invention, it is preferable that the workpiece transfer system includes: a plurality of workpiece storage units placed so as to be stacked in a vertical direction, a plurality of transfer mechanisms for transferring each of the plurality of workpiece storage units, and a plurality of robots, the number of robots being equal to or greater than the number of the plurality of workpiece storage units; wherein each of the robots includes; an end effector on which the workpiece is mounted, and a lifting mechanism for lifting up and down the end effector; the plurality of robots are placed in a transfer direction of the workpiece storage units; the plurality of workpiece storage units are placed below the plurality of robots; and a lower limit position of each moving range of the end effector provided to each of the plurality of robots is lowered in a stepwise manner in the transfer direction of the workpiece storage units, and the lower limit position is set according to an elevation of each of the plurality of workpiece storage units. According to this configuration, it is possible to associate one of the plurality of workpiece storage units with one of the plurality of robots one-on-one. As a result, the workpiece transfer system can be controlled easily. Furthermore, according to this configuration, a lower limit position of each moving range of the end effector provided to each of the plurality of robots is lowered in a stepwise manner in the transfer direction of the workpiece storage units, and the lower limit position is set according to an elevation of each of the plurality of workpiece storage units; and therefore, it becomes possible to prevent an interference of a robot associated with a certain workpiece storage unit and any workpiece storage unit other than the workpiece storage unit associated with the robot, by way of adjusting moving ranges of the plurality of workpiece storage units. Then, it becomes possible to carry out operations of the plurality of robots and transfers of the plurality of workpiece storage units at the same time freely. As a result, the production efficiency of the production line, in which the workpiece transfer system is used, can effectively be improved.

In at least an embodiment of the present invention, it is preferable that the workpiece storage units, being placed below the robots, move through an area away from a working space of the robots. According to this configuration, it becomes possible to prevent an interference of the robots during operations and the workpiece storage units in motion. Then, it becomes possible to carry out operations of the robots and transfers of the workpiece storage units at the same time freely. As a result, the production efficiency of the production line, in which the workpiece transfer system is used, can effectively be improved. Furthermore, according to this configuration, process modules can be placed at both sides of the robots in a direction of bringing in and taking out a workpiece.

As described above, at least an embodiment of the present invention makes it possible to improve a production efficiency of a production line in which a workpiece transfer system is used.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DESCRIPTION OF THE PREFERRED EMBODIMENTS

Embodiments of the present invention are described below with reference to the accompanying drawings.

First Embodiment

Configuration of Workpiece Transfer System

Figure 1:
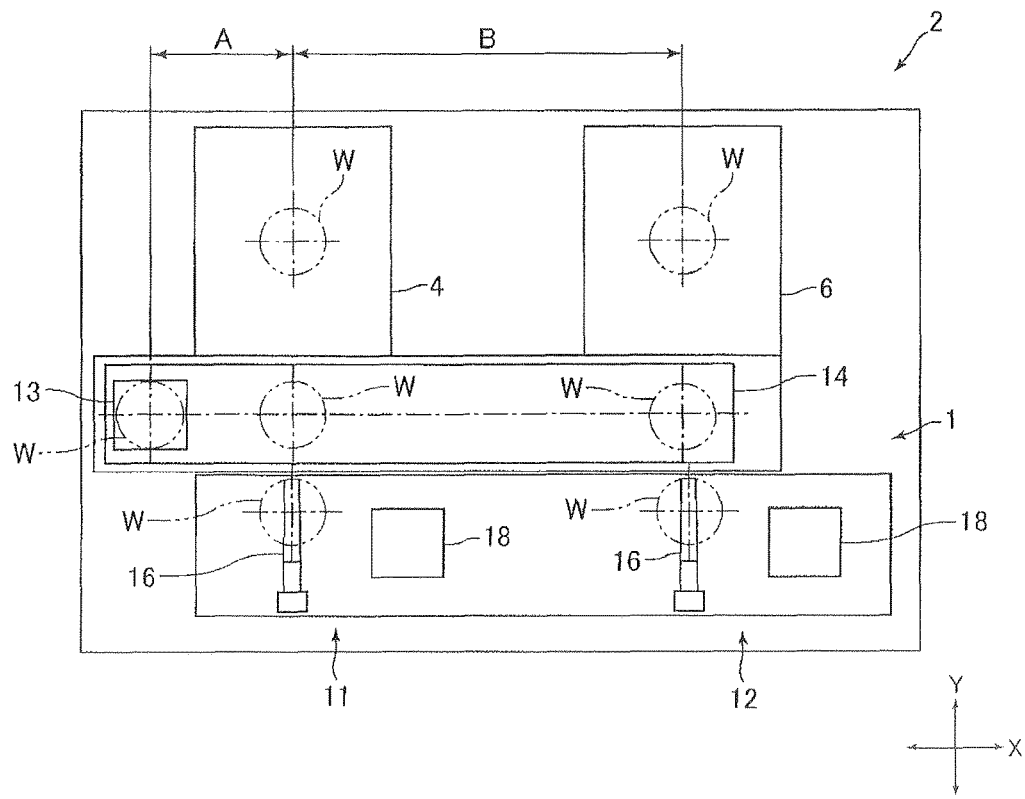
FIG. 1 is a plan view for explaining a configuration of a production line in which a workpiece transfer system according to a first embodiment of the present invention is used.
Figure 2:
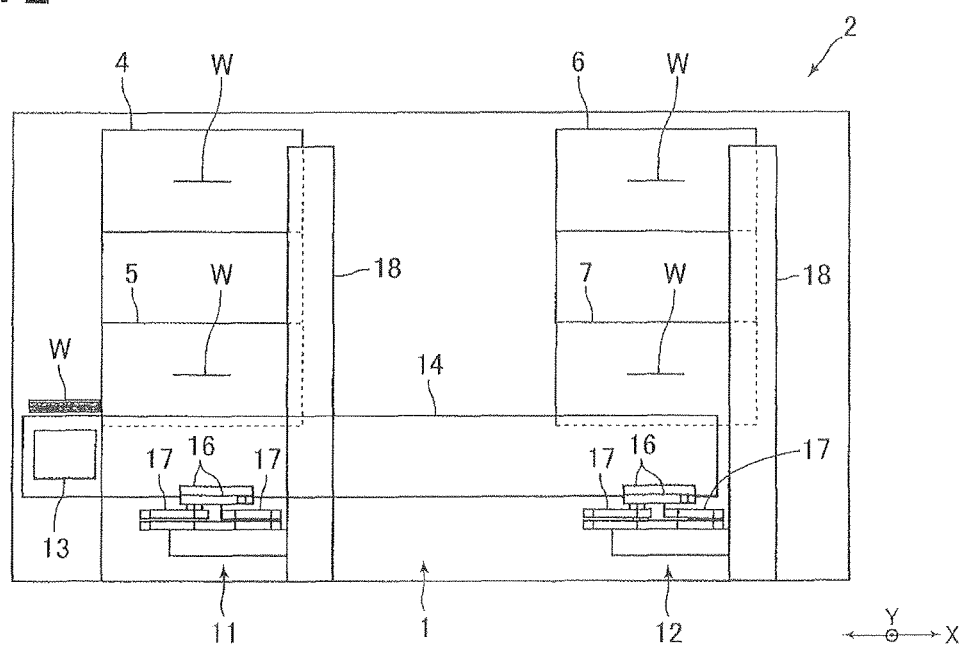
FIG. 2 is a side view for explaining the configuration of the production line shown in FIG. 1.

FIG. 1 is a plan view for explaining a configuration of a production line 2 in which a workpiece transfer system 1 according to a first embodiment of the present invention is used. FIG. 2 is a side view for explaining the configuration of the production line 2 shown in FIG. 1.

The workpiece transfer system 1 according to the present embodiment is a system for transferring a semiconductor wafer W (a wafer W), as a workpiece, in the production line 2 for production of semiconductors. In the production line 2, several processing operations are sequentially conducted for the wafer W. The production line 2 includes an EFEM, being not illustrated in the drawings; and process modules 4 through 7 which conduct a predetermined processing operation for the wafer W. The production line 2 according to the present embodiment includes four process modules 4 through 7. As a general rule, the process modules 4 through 7 include a gate for taking the wafer W in and out (not shown).

The process module 4 and the process module 5 are so placed as to be stacked in a vertical direction, and meanwhile the process module 6 and the process module 7 are so placed as to be stacked in a vertical direction. Moreover, the process modules 4 & 5 and the process modules 6 & 7 are so placed as to have a predetermined space between their two groups, in a direction X that is one of horizontal directions. In the present embodiment, the process modules 4 & 5 are located closer to the EFEM than the process modules 6 & 7 are. Moreover, the process modules 4 & 5 and the process modules 6 & 7 are placed at the same position in a direction Y that is one of the horizontal directions, wherein the direction Y is perpendicular to the direction X. Furthermore, the process modules 4 and the process modules 6 are placed at the same elevation, and meanwhile the process module 5 and the process module 7 are placed at the same elevation.

The workpiece transfer system 1 includes: a robot 11 for bringing in a wafer W to the process modules 4 & 5 and taking out a wafer W from the process modules 4 & 5; a robot 12 for bringing in a wafer W to the process modules 6 & 7 and taking out a wafer W from the process modules 6 & 7; a wafer storage unit 13 as a workpiece storage unit, in which wafers W to be brought into the process modules 4 through 7 as well as wafers W taken out from the process modules 4 through 7 are stored; and a transfer mechanism 14 for transferring the wafer storage unit 13 in the direction X.

The robot 11 and the robot 12 are so-called SCARA (Selective Compliance Assembly Robot Arm) robots. Each of the robot 11 and the robot 12 is equipped with two end effectors (hands) 16 for grasping a wafer W (or getting a wafer W mounted). Furthermore, each of the robot 11 and the robot 12 includes: an arm 17 to which the end effector 16 is connected so as to be rotatable; an arm driving mechanism for elongating/contracting the arm 17 to move the end effector 16; and a lifting mechanism 18 for lifting up and down the end effector 16 and the arm 17. The robot 11 is placed in front of the process modules 4 and 5, and the robot 12 is placed in front of the process modules 6 and 7. In the present embodiment, the robot 11 is fixed at a position in front of the process modules 4 and 5, and the robot 12 is fixed at a position in front of the process modules 6 and 7. Furthermore, the robot 11 and the robot 12 are placed at the same position in the direction Y.

In the robot 11 and the robot 12, the lifting mechanism 18 lifts up and down the end effector 16 in such a way that an elevation of the gate of the process modules 4 through 7 becomes the same as an elevation of the end effector 16. Moreover, in the robot 11 and the robot 12, the arm driving mechanism elongates/contracts the arm 17 so as to move the end effector 16 linearly in the direction Y, in such a way as to bring a wafer W into the process modules 4 through 7 and take out a wafer W from the process modules 4 through 7.

The wafer storage unit 13 is so shaped as to be, for example, like a box, in such a way as to become able to store wafers W. The wafer storage unit 13 is able to store a plurality of wafers W. In the present embodiment, the wafer storage unit 13 is able to store two wafers W. The wafer storage unit 13 is located between the process modules 4 through 7 and the robots 11 & 12, in the direction Y. Furthermore, the wafer storage unit 13 is able to move in the direction X among an origin position (a position shown in FIG. 1 and FIG. 2) where a wafer W is supplied from the EFEM, the process modules 4 & 5, and the process modules 6 & 7, in such a way that the wafer storage unit 13 transfers a wafer W in the direction X among the origin position, the process modules 4 & 5, and the process modules 6 & 7. Incidentally, a wafer W stored in the EFEM is supplied to the wafer storage unit 13, located at the origin position, by a robot that is not illustrated in the drawings.

For example, the transfer mechanism 14 includes a turning-type motor, a lead screw that is connected to the turning-type motor and placed so as to have its longitudinal direction in the direction X, a nut component that is fixed to the wafer storage unit 13 and engaged with the lead screw, a guide rail placed so as to have its longitudinal direction in the direction X, and guide block that is fixed to the wafer storage unit 13 and engaged with the guide rail. Alternatively, the transfer mechanism 14 includes, for example, a linear motor and a timing belt, instead of the turning-type motor, the lead screw, and the nut component that are described above.

In the production line 2, though sometimes the wafer W after being processed at one of the process modules 4 through 7 is subsequently supplied to another one of the process modules 4 through 7 for completing a predetermined process, the wafer W is usually returned to the EFEM. Then, at each of the process modules 4 through 7, a predetermined processing operation is conducted on the wafer W. In the present embodiment; for example, when wafers W are brought into the process module 4 and the process module 6, two wafers are supplied at first in the production line 2 from the EFEM to the wafer storage unit 13 being located at the origin position, and stored in the wafer storage unit 13; wherein one of the two wafers being a wafer W to be processed at the process module 4 and the other being a wafer W to be processed at the process module 6. Incidentally, in the following explanation, it is assumed that the process module 4 and the process module 6 have processed wafers W.

Subsequently, the wafer storage unit 13 transfers the stored wafers W to an installation spot of the robot 11 (namely, an installation spot of the process modules 4 & 5). After the wafers W are transferred to the installation spot of the robot 11, the robot 11 takes out the wafer W processed at the process module 4 from the process module 4 by using one of its two end effectors 16; and at the same time, the robot 11 takes out the wafer W from the wafer storage unit 13, and brings the wafer W into the process module 4, by using the other of its two end effectors 16. Moreover, the robot 11 places the wafer W, being grasped by the said one of its end effectors 16 after having been taken out of the process module 4, onto the wafer storage unit 13.

Subsequently, the wafer storage unit 13 moves to an installation spot of the robot 12 (namely, an installation spot of the process modules 6 & 7). Namely, the wafer storage unit 13 transfers the wafer W that has been processed at the process module 4, and the wafer W that has been stored at the origin position, to the installation spot of the robot 12. The robot 12 takes out the wafer W processed at the process module 6 from the process module 6 by using one of its two end effectors 16; and at the same time, the robot 12 takes out the wafer W, stored at the origin position, from the wafer storage unit 13, and brings the wafer W into the process module 6, by using the other of its two end effectors 16. Moreover, the robot 12 places the wafer W, being grasped by the said one of its end effectors 16 after having been taken out of the process module 6, onto the wafer storage unit 13.

Subsequently, the wafer storage unit 13 moves to the origin position. Just after the wafer storage unit 13 moves to the origin position, two wafers W stored in the wafer storage unit 13 (namely, one wafer W processed at the process module 4 and the other wafer W processed at the process module 6) are, for example, returned to the EFEM, by the robot that is not illustrated in the drawings. Then, by way of repeating these operations, the production line 2 executes a predetermined process for the wafer W.

Incidentally, after the wafer W taken out from the process module 4 and grasped by one of the end effectors 16 is placed onto the wafer storage unit 13, as well as the wafer W is taken out from the wafer storage unit 13 by using the other of the end effectors 16, the wafer storage unit 13 may move from the installation spot of the robot 11 to the installation spot of the robot 12 at the same time as the robot 11 starts bringing the wafer W grasped by the said other of the end effectors 16, into the process module 4. Furthermore, after the wafer W taken out from the process module 6 and grasped by one of the end effectors 16 is placed onto the wafer storage unit 13, as well as the wafer W is taken out from the wafer storage unit 13 by using the other of the end effectors 16, the wafer storage unit 13 may move from the installation spot of the robot 12 to the origin position at the same time as the robot 12 starts bringing the wafer W grasped by the said other of the end effectors 16, into the process module 6.

Primary Advantageous Effect of the Present Embodiment

As described above, the wafer storage unit 13 shaped like a box or equivalent is able to move in the direction X among the origin position, the process modules 4 & 5, and the process modules 6 & 7 in the present embodiment. Therefore, in the present embodiment, for transferring the wafers in the direction X, it is simply needed to move the wafer storage unit 13 that can have a reduced lighter weight, being compared to the robot 11 and the robot 12, in the direction X. Accordingly, in the present embodiment, the wafer storage unit 13 can safely be moved, even though a moving speed of the wafer storage unit 13 is set to be comparatively higher. In other words, in the present embodiment, efficiency of transferring the wafers W can be improved by way of increasing the moving speed of the wafer storage unit 13. As a result, production efficiency of the production line 2 can be improved in the present embodiment. Furthermore, since the moving speed of the wafer storage unit 13 can be increased in the present embodiment, the production efficiency of the production line 2 can be further improved in the case of a long transfer distance of wafers W in the production line 2 (namely, either or both of a distance between the origin position and the installation spot of the robot 11, and a distance between the installation spot of the robot 11 and the installation spot of the robot 12, is long).

In the present embodiment, the workpiece transfer system 1 includes two robots; i.e., the robot 11 and the robot 12, and meanwhile the wafer storage unit 13 is able to store two wafers W. Therefore, in the present embodiment as described above, in the case where the wafer storage unit 13 located at the origin position stores two wafers; for example, one of the wafers W to be processed at the process module 4 and the other of the wafers W to be processed at the process module 6, the robot 12 can carries out a wafer W take-out operation and a wafer W bring-in operation in relation to the process module 6, even though the wafer storage unit 13 moves to the installation spot of the robot 12, without once returning to the origin position, after the robot 11 carries out a wafer W take-out operation and a wafer W bring-in operation in relation to the process module 4.

Therefore, as shown in FIG. 1, wherein a distance between the origin position of the wafer storage unit 13 and the robot 11 (namely, a distance between the origin position of the wafer storage unit 13 and the process modules 4 & 5) in the direction X is defined as "A"; and a distance between the robot 11 and the robot 12 (namely, a distance between the process modules 4 & 5 and the process modules 6 & 7) in the direction X is defined as "B"; a travelling distance of the wafer storage unit 13 in an operation step with starting from the origin position, bringing the wafers W into the process module 4 and the process module 6, and subsequently returning to the origin position, in the production line 2 of the present embodiment, is expressed as (2A+2B).

Figure 6:
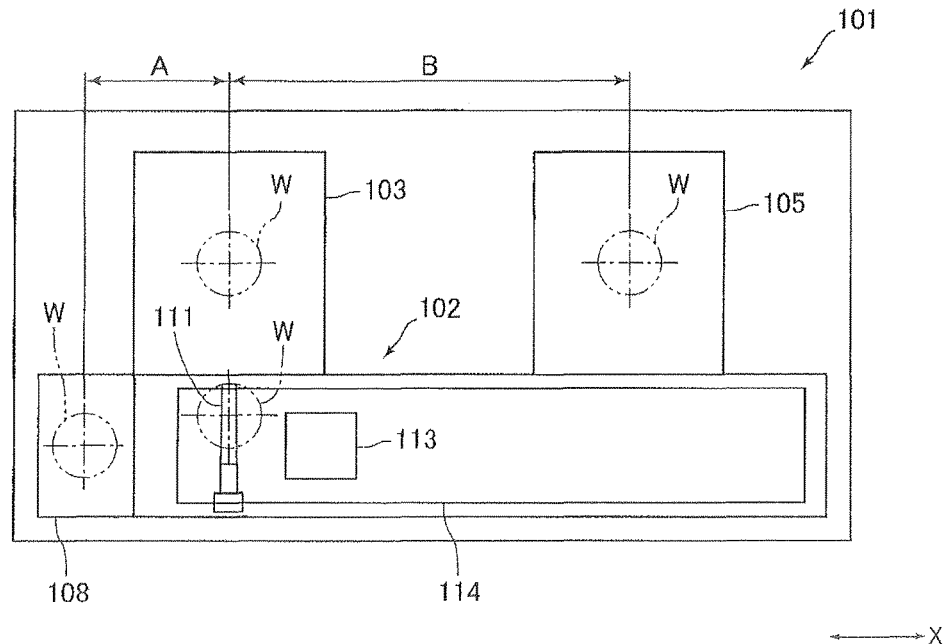
FIG. 6 is a plan view for explaining a configuration of a production line according to a conventional technology.
Figure 7:
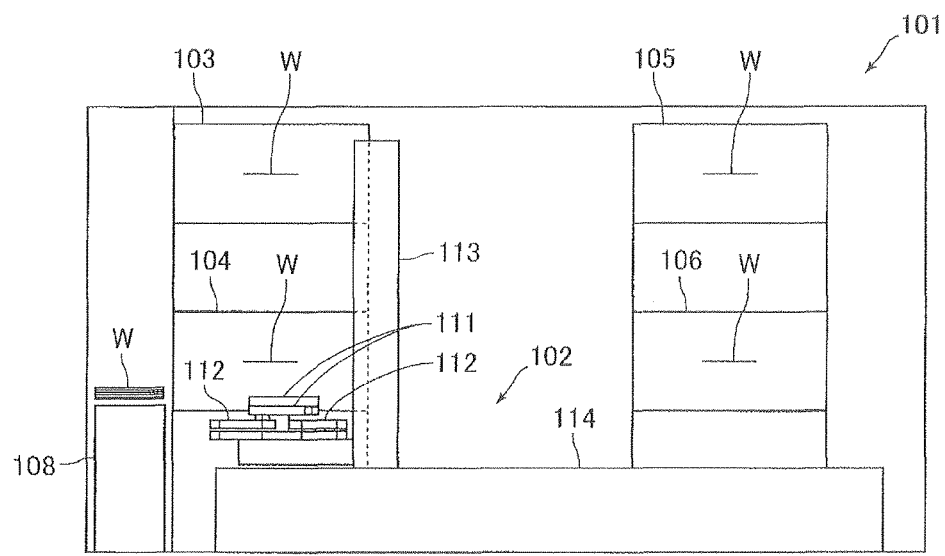
FIG. 7 is a side view for explaining the configuration of the production line shown in FIG. 6.

On the other hand, in the case of the conventional production line 101, for bringing wafers W into the process module 103 and the process module 105 as described above, the robot 102 once returns to the buffer 108 after bringing a wafer W into the process module 103, and then moves to the process module 105 to bring a wafer W into the process module 105. Therefore, as shown in FIG. 6, wherein a distance between the buffer 108 and the process modules 103 & 104 in the direction X is defined as "A" in a similar way; and a distance between the process modules 103 & 104 and the process modules 105 & 106 in the direction X is defined as "B" in a similar way; a travelling distance of the robot 102 in an operation step with starting from the buffer 108, bringing the wafers W into the process module 103 and the process module 105, and subsequently returning to buffer 108, in the conventional production line 101, is expressed as (4A+2B).

Namely, in the direction X, if the distance between the buffer 108 and the process modules 103 & 104 is equal to the distance between the origin position of the wafer storage unit 13 and the process modules 4 & 5, and furthermore the distance between the process modules 103 & 104 and the process modules 105 & 106 is equal to the distance between the process modules 4 & 5 and the process modules 6 & 7, the travelling distance of the wafer storage unit 13 for bringing in the wafers W into the process module 4 and the process module 6 is shorter by a distance of 2A than the travelling distance for bringing in the wafers W into the process module 103 and the process module 105. Accordingly, being compared to the conventional production line 101, the production line 2 according to the present embodiment can effectively improve the production efficiency.

In the present embodiment, the wafer storage unit 13 is located between the process modules 4 through 7 and the robots 11 & 12, in the direction Y that is a travelling direction of an end effector 16. Therefore, in the present embodiment, it is simply needed for the end effector 16 to move from a specified standby position toward the wafer storage unit 13, and further move in the same direction as it has done, even after receiving a wafer W at the wafer storage unit 13 in order to bring the wafer W into the process modules 4 through 7. Moreover, the end effector 16 that has moved from the process modules 4 through 7 toward the wafer storage unit 13 and stored the wafer W in the wafer storage unit 13 simply needs to move in the same direction as it has done, to the specified standby position. Therefore, in the present embodiment, it is not needed to provide a rotation mechanism for rotating the end effectors 16 and the arms 17 around a root-end side portion of the arms 17 while using a vertical direction as a shaft direction. As a result, in the present embodiment, configurations of the robot 11 and the robot 12 can be simplified. Moreover, control of the robot 11 and the robot 12 can be simplified.

In the present embodiment, the wafer storage unit 13 is able to move in the direction X among the origin position, the process modules 4 & 5, and the process modules 6 & 7. Therefore, in the present embodiment, it is not needed to provide the robot 11 and the robot 12 with a configuration that move the end effectors 16 and the arms 17 in the direction X. Accordingly, in the present embodiment, configurations of the robot 11 and the robot 12 can be simplified.

Modification Examples of the First Embodiment

In the first embodiment, the workpiece transfer system 1 is equipped with a wafer storage unit 13, and a transfer mechanism 14 that move the wafer storage unit 13 in the direction X. Alternatively, for example, the workpiece transfer system 1 may include two wafer storage units; one of the two wafer storage unit is an exclusive-use wafer storage unit that transfers a wafer W supplied from the EFEM to the installation spot of the process modules 4 through 7, and the other of the two wafer storage unit is an exclusive-use wafer storage unit that transfers a wafer W, processed at the process modules 4 through 7, from the installation spot of the process modules 4 through 7 to the EFEM; and two transfer mechanisms that individually transfer each of the two wafer storage units in the direction X. Further alternatively, the workpiece transfer system 1 may include two wafer storage units; one of the two wafer storage units is an exclusive-use wafer storage unit that transfers a wafer W between the EFEM and the installation spot of the process modules 4 & 5, and the other of the two wafer storage units is an exclusive-use wafer storage unit that transfers a wafer W between the EFEM and the installation spot of the process modules 6 & 7; and two transfer mechanisms that individually transfer each of the two wafer storage units in the direction X. Further alternatively, the workpiece transfer system 1 may include three or more wafer storage units and three or more transfer mechanisms that individually transfer each of the three or more wafer storage units in the direction X. In this case, the production efficiency of the production line 2 can be further improved.

In the first embodiment; two robots, namely the robot 11 and the robot 12, are installed in the production line 2. Alternatively, for example, in the case where the production line 2 includes only the process modules 4 & 5, it is simply needed for the production line 2 to include only one robot, namely the robot 11. In this case, the number of wafers W that the wafer storage unit 13 can store may be one. Further alternatively, the number of robots that are installed in the production line 2 may be three or more, depending on a layout of process modules.

In the first embodiment, the robot 12 takes out a wafer W, which has been stored at the origin position, from the wafer storage unit 13, and brings the wafer W into the process module 6. Alternatively, for example, the robot 12 may take out a wafer W, which has been processed at the process module 4, from the wafer storage unit 13, and brings the wafer W into the process module 6. Moreover, though the wafer storage unit 13 can store two wafers W in the first embodiment, the wafer storage unit 13 may be able to store three or more wafers W. In this case, for a further improvement of the production efficiency of the production line 2, it is preferable that the wafer storage unit 13 is able to store five or more wafers W.

Though the wafer storage unit 13 is placed between the process modules 4 through 7 and the robots 11 and 12 in the direction Y in the first embodiment, a location of the wafer storage unit 13 is not limited to this position. For example, the wafer storage unit 13 may be placed in such a way that the robots 11 and 12 are sandwiched between the process modules 4 through 7 and the wafer storage unit 13 in the direction Y. Moreover, though one workpiece transfer system 1 is installed in the production line 2 in the first embodiment, two or more workpiece transfer systems 1 may be installed in the production line 2.

Second Embodiment

Configuration of Workpiece Transfer System

Figure 3:
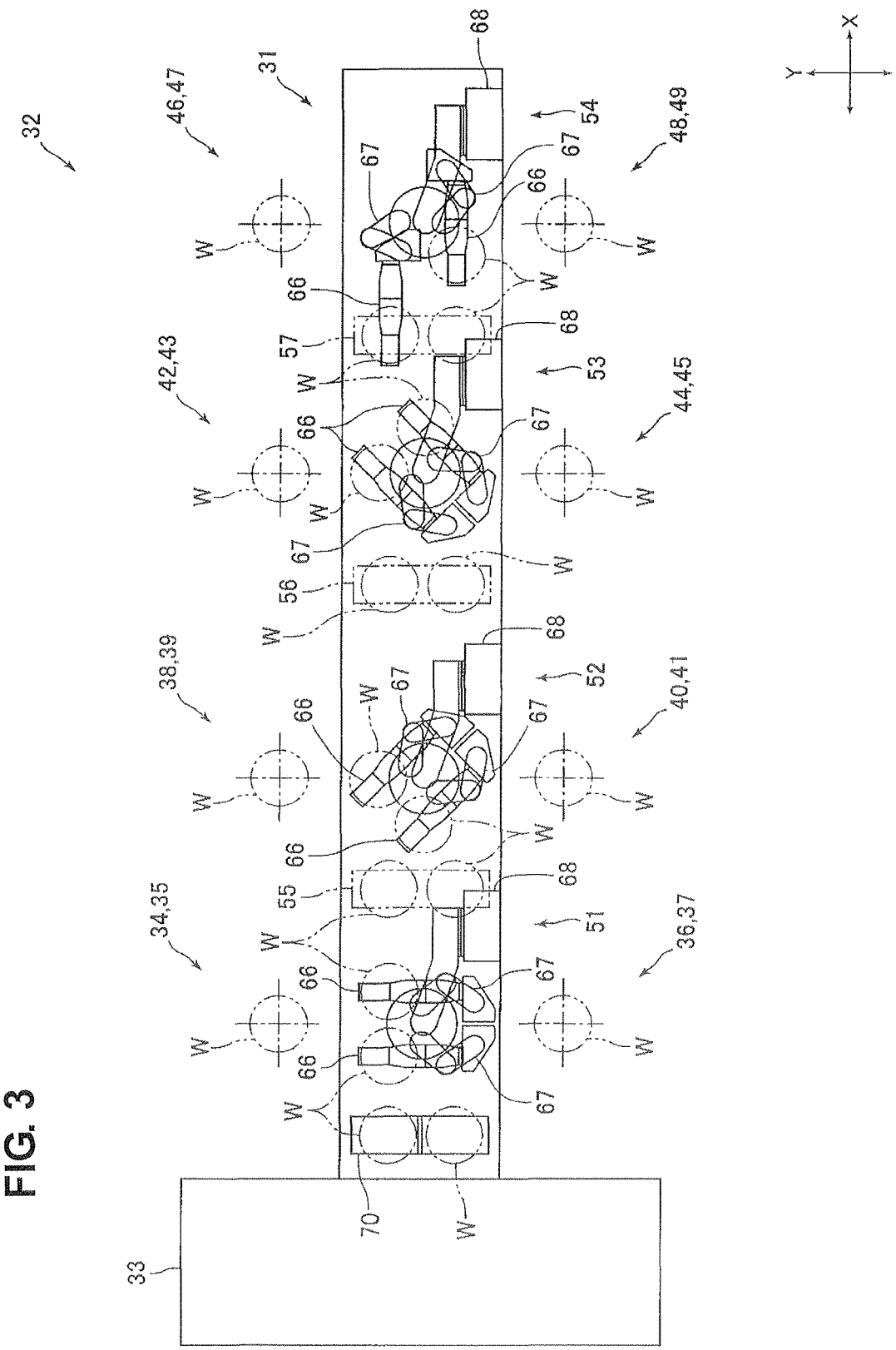
FIG. 3 is a plan view for explaining a configuration of a production line in which a workpiece transfer system according to a second embodiment of the present invention is used.
Figure 4:
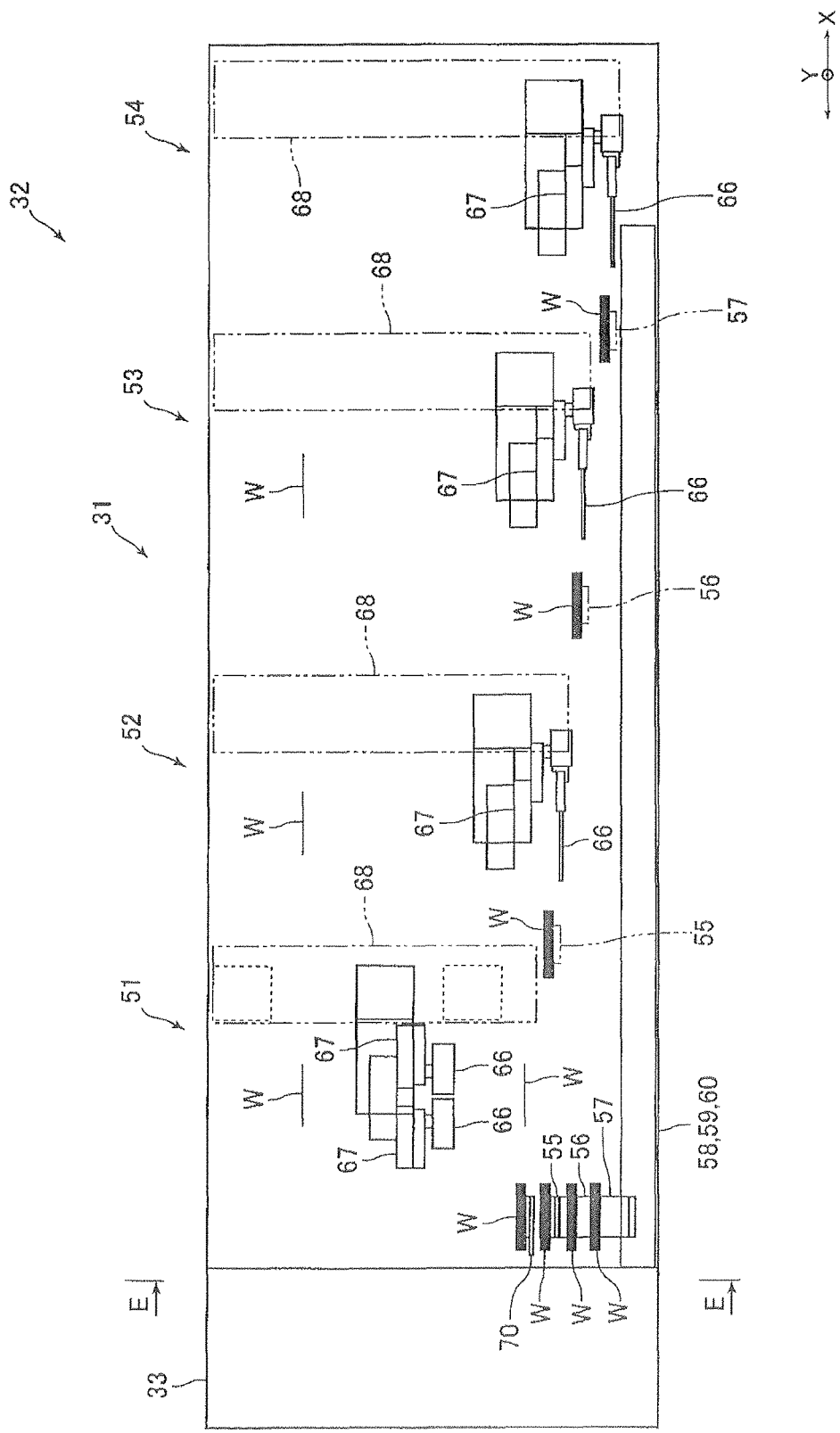
FIG. 4 is a side view for explaining the configuration of the production line shown in FIG. 3.
Figure 5:
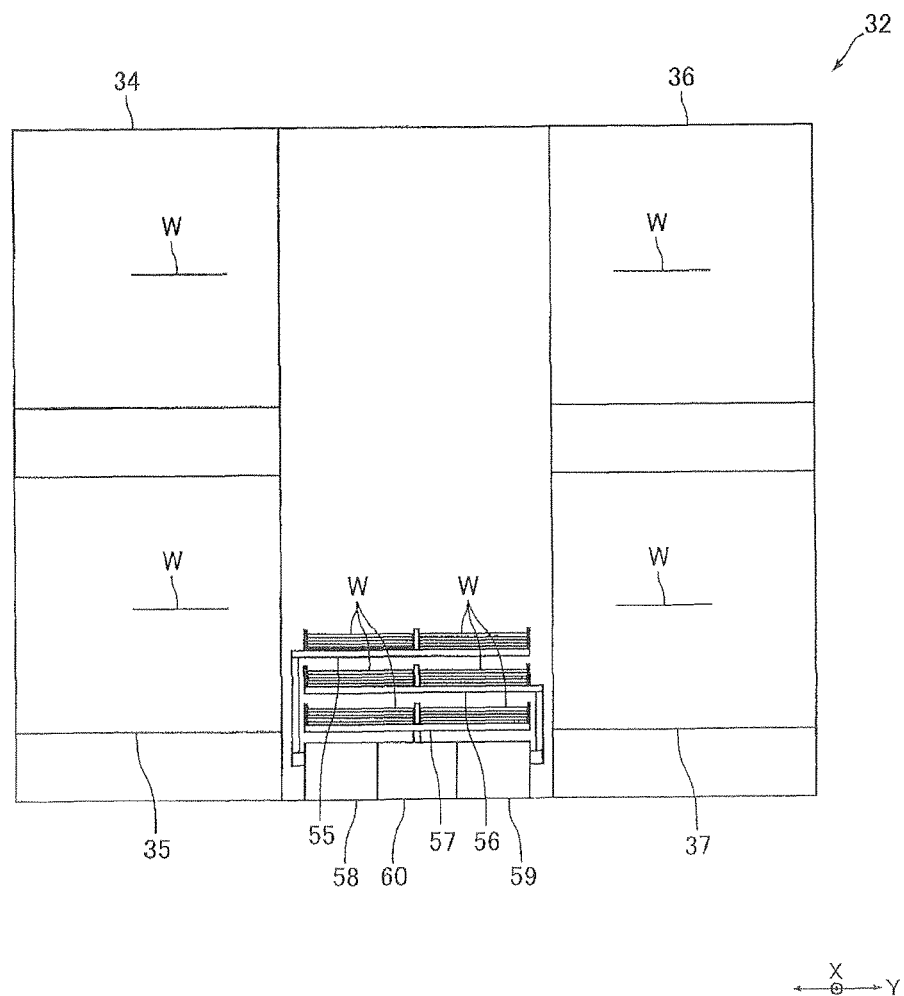
FIG. 5 is a drawing for explaining the configuration of the production line, in a view of an E-E direction shown in FIG. 4.

FIG. 3 is a plan view for explaining a configuration of a production line 32 in which a workpiece transfer system 31 according to a second embodiment of the present invention is used. FIG. 4 is a side view for explaining the configuration of the production line 32 shown in FIG. 3. FIG. 5 is a drawing for explaining the configuration of the production line 32, in a view of an E-E direction shown in FIG. 4.

The workpiece transfer system 31 according to the present embodiment is a system for transferring a semiconductor wafer W in the production line 32 for production of semiconductors, as the workpiece transfer system 1 of the first embodiment is. The production line 32 includes an EFEM 33 and 16 process modules 34 through 49 which conduct a predetermined processing operation for a wafer W. The process modules 34 through 49 include a gate for taking the wafer W in and out (not shown).

The process module 34 and the process module 35 are so placed as to be stacked in a vertical direction, the process module 36 and the process module 37 are so placed as to be stacked in a vertical direction, the process module 38 and the process module 39 are so placed as to be stacked in a vertical direction, the process module 40 and the process module 41 are so placed as to be stacked in a vertical direction, the process module 42 and the process module 43 are so placed as to be stacked in a vertical direction, the process module 44 and the process module 45 are so placed as to be stacked in a vertical direction, the process module 46 and the process module 47 are so placed as to be stacked in a vertical direction, and then the process module 48 and the process module 49 are so placed as to be stacked in a vertical direction.

Moreover, the process modules 34 & 35 and the process modules 36 & 37 are placed at the same position in a direction X that is one of horizontal directions, and the process modules 34 & 35 and the process modules 36 & 37 are so placed as to have a predetermined space between their two groups, in a direction Y that is one of the horizontal directions, wherein the direction Y is perpendicular to the direction X. The process modules 38 & 39 and the process modules 40 & 41 are placed at the same position in the direction X, and the process modules 38 & 39 and the process modules 40 & 41 are so placed as to have a predetermined space between their two groups, in the direction Y. The process modules 42 & 43 and the process modules 44 & 45 are placed at the same position in the direction X, and the process modules 42 & 43 and the process modules 44 & 45 are so placed as to have a predetermined space between their two groups, in the direction Y. Then, the process modules 46 & 47 and the process modules 48 & 49 are placed at the same position in the direction X, and the process modules 46 & 47 and the process modules 48 & 49 are so placed as to have a predetermined space between their two groups, in the direction Y.

Moreover, the process modules 34 through 37, the process modules 38 through 41, the process modules 42 through 45, and the process modules 46 through 49 are placed at certain intervals in the direction X. The process modules 34 through 37, the process modules 38 through 41, the process modules 42 through 45, and the process modules 46 through 49 are placed in this order from a side of the EFEM 33 in the present embodiment.

Furthermore, the process modules 34 & 35, the process modules 38 & 39, the process modules 42 & 43, and the process modules 46 & 47 are placed at the same position in a direction Y; and meanwhile, the process modules 36 & 37, the process modules 40 & 41, the process modules 44 & 45, and the process modules 48 & 49 are placed at the same position in the direction Y. Moreover, the process module 34, the process module 36, the process module 38, the process module 40, the process module 42, the process module 44, the process module 46, the process module 48, are placed at the same elevation; and meanwhile, the process module 35, the process module 37, the process module 39, the process module 41, the process module 43, the process module 45, the process module 47, the process module 49, are placed at the same elevation.

The workpiece transfer system 31 includes: a robot 51 for bringing in and taking out a wafer W with respect to the process modules 34 through 37; a robot 52 for bringing in and taking out a wafer W with respect to the process modules 38 through 41; a robot 53 for bringing in and taking out a wafer W with respect to the process modules 42 through 45; a robot 54 for bringing in and taking out a wafer W with respect to the process modules 46 through 49; a wafer storage unit 55 as a workpiece storage unit, in which wafers W to be brought in and taken out with respect to the process modules 38 through 41 are stored; a wafer storage unit 56 as a workpiece storage unit, in which wafers W to be brought in and taken out with respect to the process modules 42 through 45 are stored; a wafer storage unit 57 as a workpiece storage unit, in which wafers W to be brought in and taken out with respect to the process modules 46 through 49 are stored; a transfer mechanism 58 for transferring the wafer storage unit 55 in the direction X; a transfer mechanism 59 for transferring the wafer storage unit 56 in the direction X; and a transfer mechanism 60 for transferring the wafer storage unit 57 in the direction X. Incidentally, the robots 51 through 54 and the like are not illustrated in FIG. 5.

The robots 51 through 54 are so-called SCARA (Selective Compliance Assembly Robot Arm) robots. Each of the robots 51 through 54 is equipped with two end effectors (hands) 66 for grasping a wafer W (or getting a wafer W mounted); two arms 67 to which the end effectors 66 are connected so as to be rotatable; an arm driving mechanism for elongating/contracting the arms 67 to move the end effectors 66; a rotation mechanism for rotating the arm 67 around a root-end side portion of the arms 67 while using a vertical direction as a shaft direction; and a lifting mechanism 68 for lifting up and down the end effectors 66, the arms 67, and the rotation mechanism.

In the direction Y; the robot 51 is placed between the process modules 34 & 35 and the process modules 36 & 37; the robot 52 is placed between the process modules 38 & 39 and the process modules 40 & 41; the robot 53 is placed between the process modules 42 & 43 and the process modules 44 & 45; and the robot 54 is placed between the process modules 46 & 47 and the process modules 48 & 49. Moreover, the robot 51 is placed in front of the process modules 34 through 37; the robot 52 is placed in front of the process modules 38 through 41; the robot 53 is placed in front of the process modules 42 through 45; and the robot 54 is placed in front of the process modules 46 through 49. In other words, the robots 51 through 54 are placed at certain intervals in the direction X. In the present embodiment, the robot 51 is fixed at a position in front of the process modules 34 through 37; the robot 52 is fixed at a position in front of the process modules 38 through 41; the robot 53 is fixed at a position in front of the process modules 42 through 45; and the robot 54 is fixed at a position in front of the process modules 46 through 49. Moreover, the robots 51 through 54 are placed at the same position in the direction Y.

Each of the wafer storage units 55 through 57 is so shaped as to be, for example, like a box, in such a way as to become able to store wafers W. Each of the wafer storage units 55 through 57 is able to store a plurality of wafers W. Moreover, in each of the wafer storage units 55 through 57, two wafers W are stored so as to be placed side by side in the direction Y. The wafer storage units 55 through 57 are so placed as to be stacked in a vertical direction. More specifically to describe, the wafer storage units 55 through 57 are so placed as to be stacked in this order from a top side. Moreover, the wafer storage units 55 through 57 are placed below the robots 51 through 54 in a vertical direction. Furthermore, the wafer storage units 55 through 57 are placed at the same position in the direction Y as the robots 51 through 54.

The wafer storage unit 55 is able to move in the direction X, from an origin position (a position shown with a solid line in FIG. 4) where a wafer W is supplied from the EFEM 33, to a position before the process modules 38 through 41 in the direction X (a position shown with a two-dot chain line in FIG. 3 and FIG. 4), and the wafer storage unit 55 can pass under the robot 51. In other words, the wafer storage unit 55 moves through an area away from working spaces of the robot 51, the robot 53, and the robot 54. The wafer storage unit 55 transfers a wafer W in the direction X, between the position before the process modules 38 through 41 in the direction X and the origin position.

The wafer storage unit 56 is able to move in the direction X, from an origin position (a position shown with a solid line in FIG. 4) where a wafer W is supplied from the EFEM 33, to a position before the process modules 42 through 45 in the direction X (a position shown with a two-dot chain line in FIG. 3 and FIG. 4), and the wafer storage unit 56 is placed at a position that makes it possible to pass under the robot 51 and the robot 52. In other words, the wafer storage unit 56 moves through an area away from working spaces of the robot 51, the robot 52, and the robot 54. The wafer storage unit 56 transfers a wafer W in the direction X, between the position before the process modules 42 through 45 in the direction X and the origin position.

The wafer storage unit 57 is able to move in the direction X, from an origin position (a position shown with a solid line in FIG. 4) where a wafer W is supplied from the EFEM 33, to a position before the process modules 46 through 49 in the direction X (a position shown with a two-dot chain line in FIG. 3 and FIG. 4), and the wafer storage unit 57 is placed at a position that makes it possible to pass under the robots 51 through 53. In other words, the wafer storage unit 57 moves through an area away from working spaces of the robots 51 through 53. The wafer storage unit 57 transfers a wafer W in the direction X, between the position before the process modules 46 through 49 in the direction X and the origin position.

In the direction X, a buffer 70 is provided between the process modules 34 through 37 and the EFEM 33. The buffer 70 is so shaped as to be, for example, like a box, in such a way as to become able to store wafers W. The buffer 70 is able to store a plurality of wafers W. Moreover, in the buffer 70, two wafers W are stored so as to be placed side by side in the direction Y. The buffer 70 is fixed at a position above the wafer storage unit 55 being placed at the origin position. Furthermore, the wafer storage units 55 through 57 are stacked in the vertical direction when they are placed at the origin position. A wafer W stored in the EFEM 33 is supplied to the wafer storage units 55 through 57, being located at the origin position, and the buffer 70, by a robot that is not illustrated in the drawings.

In the same manner as the transfer mechanism 14 of the first embodiment, for example, each of the transfer mechanisms 58 through 60 includes a turning-type motor, a lead screw that is connected to the turning-type motor and placed so as to have its longitudinal direction in the direction X, a nut component that is fixed to each of the wafer storage units 55 through 57 and engaged with the lead screw, a guide rail placed so as to have its longitudinal direction in the direction X, and a guide block that is fixed to each of the wafer storage units 55 through 57 and engaged with the guide rail.

In the production line 32, the robot 51 takes out a wafer W, which has been pretreated, from the buffer 70 and brings the wafer W into the process modules 34 through 37, and takes out a processed wafer W, which has been processed in the process modules 34 through 37, and then places the wafer W onto the buffer 70. The robot 52 takes out a wafer W, which has been pretreated, from the wafer storage unit 55 being stopped at a position before the process modules 38 through 41 in the direction X, and brings the wafer W into the process modules 38 through 41, and takes out a processed wafer W, which has been processed in the process modules 38 through 41, and then places the wafer W onto the wafer storage unit 55 being stopped at the position before the process modules 38 through 41 in the direction X. The robot 53 takes out a wafer W, which has been pretreated, from the wafer storage unit 56 being stopped at a position before the process modules 42 through 45 in the direction X, and brings the wafer W into the process modules 42 through 45, and takes out a processed wafer W, which has been processed in the process modules 42 through 45, and then places the wafer W onto the wafer storage unit 56 being stopped at the position before the process modules 42 through 45 in the direction X. The robot 54 takes out a wafer W, which has been pretreated, from the wafer storage unit 57 being stopped at a position before the process modules 46 through 49 in the direction X, and brings the wafer W into the process modules 46 through 49, and takes out a processed wafer W, which has been processed in the process modules 46 through 49, and then places the wafer W onto the wafer storage unit 57 being stopped at the position before the process modules 46 through 49 in the direction X.

In the robot 51, the lifting mechanism 68 lifts up and down the end effector 66 in such a way that an elevation of a gate of the process modules 34 through 37 becomes the same as an elevation of the end effector 66. Moreover, in the robot 51, the arm driving mechanism elongates/contracts the arm 67 so as to move the end effector 66 linearly, and meanwhile the arm 67 turns around its root-end side portion, in such a way as to bring a wafer W out of the buffer 70 into the process modules 34 through 37, and bring a wafer W out of the process modules 34 through 37 into the buffer 70. In the robot 51, a lower limit position of a moving range of the end effector 66 is set according to an elevation of the buffer 70. Namely, in the robot 51, the lower limit position of the moving range of the end effector 66 is almost the same as the elevation of the buffer 70. Therefore, as described above, the wafer storage units 55 through 57 are able to pass under the robot 51.

In the robot 52, the lifting mechanism 68 lifts up and down the end effector 66 in such a way that an elevation of a gate of the process modules 38 through 41 becomes the same as an elevation of the end effector 66. Moreover, in the robot 52, the arm driving mechanism elongates/contracts the arm 67 so as to move the end effector 66 linearly, and meanwhile the arm 67 turns around its root-end side portion, in such a way as to bring a wafer W out of the wafer storage unit 55 into the process modules 38 through 41, and bring a wafer W out of the process modules 38 through 41, into the wafer storage unit 55. In the robot 52, a lower limit position of a moving range of the end effector 66 is set according to an elevation of the wafer storage unit 55, so as to be almost the same as the elevation of the wafer storage unit 55. Therefore, as described above, the wafer storage units 56 and 57 are able to pass under the robot 52.

In the robot 53, the lifting mechanism 68 lifts up and down the end effector 66 in such a way that an elevation of a gate of the process modules 42 through 45 becomes the same as an elevation of the end effector 66. Moreover, in the robot 53, the arm driving mechanism elongates/contracts the arm 67 so as to move the end effector 66 linearly, and meanwhile the arm 67 turns around its root-end side portion, in such a way as to bring a wafer W out of the wafer storage unit 56 into the process modules 42 through 45, and bring a wafer W out of the process modules 42 through 45, into the wafer storage unit 56. In the robot 53, a lower limit position of a moving range of the end effector 66 is set according to an elevation of the wafer storage unit 56, so as to be almost the same as the elevation of the wafer storage unit 56. Therefore, as described above, the wafer storage unit 57 is able to pass under the robot 53.

In the robot 54, the lifting mechanism 68 lifts up and down the end effector 66 in such a way that an elevation of a gate of the process modules 46 through 49 becomes the same as an elevation of the end effector 66. Moreover, in the robot 54, the arm driving mechanism elongates/contracts the arm 67 so as to move the end effector 66 linearly, and meanwhile the arm 67 turns around its root-end side portion, in such a way as to bring a wafer W out of the wafer storage unit 57 into the process modules 46 through 49, and bring a wafer W out of the process modules 46 through 49, into the wafer storage unit 57. In the robot 54, a lower limit position of a moving range of the end effector 66 is set according to an elevation of the wafer storage unit 57, so as to be almost the same as the elevation of the wafer storage unit 57.

Primary Advantageous Effect of the Present Embodiment

As described above, in the present embodiment, each of the wafer storage units 55 through 57 shaped like a box or equivalent is able to move in the direction X; and therefore, production efficiency of the production line 32 can be improved, in the same manner as the production efficiency of the first embodiment is.

Furthermore, in the present embodiment, the wafer storage unit 55 is able to move in the direction X, from the origin position to the position before the process modules 38 through 41 in the direction X; the wafer storage unit 56 is able to move in the direction X, from the origin position to the position before the process modules 42 through 45 in the direction X; and the wafer storage unit 57 is able to move in the direction X, from the origin position to the position before the process modules 46 through 49 in the direction X. Moreover, in the robot 51, the lower limit position of the moving range of the end effector 66 is set according to the elevation of the buffer 70; in the robot 52, the lower limit position of the moving range of the end effector 66 is set according to the elevation of the wafer storage unit 55; in the robot 53, the lower limit position of the moving range of the end effector 66 is set according to the elevation of the wafer storage unit 56; and in the robot 54, the lower limit position of the moving range of the end effector 66 is set according to the elevation of the wafer storage unit 57.

Therefore, in the present embodiment, it is possible to associate the robot 51 with the buffer 70 one-on-one, to associate the robot 52 with the wafer storage unit 55 one-on-one, to associate the robot 53 with the wafer storage unit 56 one-on-one, and to associate the robot 54 with the wafer storage unit 57 one-on-one. As a result, the workpiece transfer system 31 can be controlled easily in the present embodiment.

Moreover, in the present embodiment, while the wafer storage units 55 through 57 being placed below the robots 51 through 54 in a vertical direction; the wafer storage unit 55 moves through the area away from the working spaces of the robot 51, the robot 53, and the robot 54; the wafer storage unit 56 moves through the area away from the working spaces of the robot 51, the robot 52, and the robot 54; and the wafer storage unit 57 moves through the area away from the working spaces of the robots 51 through 53. Therefore, in the present embodiment, it becomes possible to prevent an interference of the robot 51 during operations and the wafer storage units 55 through 57 in motion; to prevent an interference of the robot 52 during operations and the wafer storage units 56 and 57 in motion; to prevent an interference of the robot 53 during operations and the wafer storage units 55 and 57 in motion; and to prevent an interference of the robot 54 during operations and the wafer storage units 55 and 56 in motion. Therefore, in the present embodiment, it becomes possible to carry out operations of the robots 51 through 54 and transfers of the wafer storage units 55 through 57 at the same time freely. As a result, the production efficiency of the production line 32 can effectively be improved.

Modification Examples of the Second Embodiment

In the second embodiment, the lower limit position of the moving range of the end effector 66 of the robot 51, the lower limit position of the moving range of the end effector 66 of the robot 52, the lower limit position of the moving range of the end effector 66 of the robot 53, and the lower limit position of the moving range of the end effector 66 of the robot 54 are different one another. Alternatively, for example, the lower limit position of the moving range of the end effector 66 of the robot 52, the lower limit position of the moving range of the end effector 66 of the robot 53, and the lower limit position of the moving range of the end effector 66 of the robot 54 may be the same as the lower limit position of the moving range of the end effector 66 of the robot 51. In this case, needed are installing a lifting mechanism for lifting the wafer storage unit 55 up to the lower limit position of the moving range of the end effector 66 of the robot 52, between the robot 51 and the robot 52; installing a lifting mechanism for lifting the wafer storage unit 56 up to the lower limit position of the moving range of the end effector 66 of the robot 53, between the robot 52 and the robot 53; and installing a lifting mechanism for lifting the wafer storage unit 57 up to the lower limit position of the moving range of the end effector 66 of the robot 54, between the robot 53 and the robot 54. Accordingly in this case, it becomes possible to prevent an interference of the robots 51 through 54 during operations and the wafer storage units 55 through 57 in motion. Then, it becomes possible to carry out operations of the robots 51 through 54 and transfers of the wafer storage units 55 through 57 at the same time freely. As a result, the production efficiency of the production line 32 can effectively be improved.

In the second embodiment, the wafer storage units 55 through 57 are placed at the same position in the direction Y as the robots 51 through 54. Alternatively, for example, the wafer storage units 55 through 57 may be located at a position displaced from the position of the robots 51 through 54 in the direction Y. Moreover, though the wafer storage units 55 through 57 are so placed as to be stacked in a vertical direction in the second embodiment, the wafer storage units 55 through 57 may be located at positions displaced one another in the direction Y. Furthermore, wafer storage units may be so located at both sides in the direction Y as to sandwich the robots 51 through 54.

In the second embodiment, the buffer 70 is provided between the process modules 34 through 37 and the EFEM 33. Alternatively, for example, a wafer storage unit movable in the direction X may be provided instead of the buffer 70, in the case where a distance between the process modules 34 through 37 and the EFEM 33 is long in the direction X.

Other Embodiments

The embodiment described above is an example of a preferred embodiment according to the present invention, and an embodiment of the present invention is not limited to the above embodiment, and various variations can be made without changing the concept of the present invention.

The workpiece to be transferred in the workpiece transfer system 1 and the workpiece transfer system 31 is a wafer W in the embodiments described above. Alternatively, for example, another type of workpiece such as an LCD panel or a solar battery panel, and the like, instead of the wafer W, may be transferred in the workpiece transfer system 1 and the workpiece transfer system 31.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

The invention claimed is:

1. A workpiece transfer system for use with a workpiece and a plurality of process modules structured to perform a predetermined processing on the workpiece, the workpiece transfer system comprising:

a plurality of robots placed in front of the plurality of process modules, each robot of the plurality of robots bringing the workpiece into one of the plurality of process modules and taking the workpiece out of the process module;

a workpiece storage unit for storing the workpiece to be brought into the process module and the workpiece taken out of the process module; and a transfer mechanism for transferring the workpiece storage unit in a direction almost perpendicular to a direction of bringing in and taking out the workpiece for the process module, wherein the plurality of robots is laid out in the transfer direction of the workpiece storage unit, wherein the workpiece storage unit is structured to store a plurality of said workpieces, wherein the plurality of process modules comprises a first group placed so as to be stacked in a vertical direction, and a second group of process modules placed so as to be stacked in a vertical direction, wherein a predetermined space is provided between the first group and the second group;

wherein each of the robots comprises:

an end effector on which the workpiece is mounted, and a lifting mechanism for lifting up and down the end effector; and wherein the workpiece storage unit is placed between the process module and the robot, in the direction of bringing in and taking out the workpiece for the process module.

2. The workpiece transfer system according to claim 1, wherein being placed below the robots, the workpiece storage units move through an area away from a working space of the robots.

3. The workpiece transfer system according to claim 1, wherein being placed below the robots, the workpiece storage units move through an area away from a working space of the robots.

* * * * *